United States Patent [19]

Sommerkamp et al.

[11] 4,034,256

[45] July 5, 1977

[54] ELECTRON GUN FOR HEATING, FUSING AND VAPORIZING

[75] Inventors: Peter Sommerkamp, Hanau am Main; Walter Heil, Neuberg, both of Germany

[73] Assignee: Leybold-Heraeus GmbH & Co., Cologne, Germany

[22] Filed: May 27, 1976

[21] Appl. No.: 691,041

[30] Foreign Application Priority Data

June 24, 1975 Germany ..................... 2528032

[52] U.S. Cl. ..................... 313/440; 313/442; 313/477 R; 313/22
[51] Int. Cl.² ..................... H01J 7/24; H01J 29/76
[58] Field of Search .......... 313/140, 442, 431, 421, 313/237, 452, 456; 250/396 ML

[56] References Cited

UNITED STATES PATENTS 3,187,216  6/1965  Sciaky ..................... 313/237

FOREIGN PATENTS OR APPLICATIONS 1,248,175  8/1967  Germany
1,955,846  1/1972  Germany ..................... 313/237

*Primary Examiner*—Robert Segal
*Attorney, Agent, or Firm*—Burgess, Dinklage & Sprung

[57] ABSTRACT

An electron gun for heating, fusing and vaporizing having a high voltage portion, an electron emitting cathode and at least one beam forming electrode associated with the cathode. An accelerating anode, a beam guiding tube extending in the direction of the beam path and surrounded by a jacket tube and an electromatic lens are also provided. One or more deflection systems are positioned in the space formed between the beam guiding tube and the jacket tube. The beam guiding tube, the jacket tube, the electromatic lens and the deflection systems are contained in a single, replaceable unit which is joined by a plurality of hollow posts parallel to the gun axis to the high-voltage portion of the gun. The space for the electromagnetic lens and the deflection systems communicates with the atmosphere through at least one of the hollow posts.

3 Claims, 3 Drawing Figures

ELECTRON GUN FOR HEATING, FUSING AND VAPORIZING

BACKGROUND

The invention relates to an electron gun for heating, fusing and vaporizing purposes, having a high-voltage part, an electron emitting cathode, at least one beam forming electrode associated with the cathode, an accelerating anode, and a beam guiding tube extending in the direction of the beam path and surrounded by a jacket tube, in which gun an electromagnetic lens and at least one deflection system are disposed in the chamber formed between the beam guiding tube and the jacket tube.

An electron gun of the kind described above is disclosed in German Pat. No. 1,248,175, which has resulted in a considerable improvement of the gun systems existing in its time, but which is in need of improvement. In this known gun, the space between the jacket tube and the beam guiding tube, in which the electromagnet lens and the coils of the deflection system are located, is traversed by a coolant (water) to prevent the thermal overloading of these coils. This necessitates an appropriate encapsulation of the coils, since the coolant might otherwise destroy the insulation and corrode the terminals. At the same time the jacket tube and the beam guiding tube are united inseparably with one another, i.e., the space or chamber containing the elctromagnetic lens and the deflection system is heremetically sealed. This is necessary mainly because a positive guidance of the coolant must be brought about by constructional measures which dictate the internal structure of the system. Any subsequent modification of the system by the partial replacement of parts associated with the optical control of the electron beam is impossible.

In the known electron gun, furthermore, the jacket tube and the beam guiding tube are joined to the high voltage insulator of the gun by a sleeve-like part which is provided with a lateral nipple for connection to a vacuum pump system. Although a vacuum that is adequate for the reliable continuous operation of the system can thus be provided even in the area of the cathode and the beam forming electrode by means of an evacuating system separate from the rest of the installation, nevertheless it is no longer easily possible to install such a gun in a vacuum chamber without a separate vacuum connection, since the relatively narrow connecting nipple would in this case impair the reliability of the evacuation of the cathode area. The creation of correspondingly large openings in the sleeve-like part would, on the other hand, impair the strength of the known construction.

THE INVENTION

The invention is addressed to the problem of improving the above-described electron gun by providing such that the coils of the electron-optical components will be contained in a perfectly insulating medium and will no longer be surrounded by a flow of cooling liquid, and that in case of necessity individual elements of the electron-optical components can be replaced by others of different design or manner of operation without the need for modifying the entire principle of construction of the gun for this purpose.

The problem is solved in the above-described electron gun by the present invention, according to which the beam guiding tube, the jacket tube, the electromagnetic lens and the deflection systems are comprised in a replaceable unit which is connected to the high-voltage part of the gun through a plurality of hollow posts parallel to the gun axis, and the chamber for the electromagnetic lens and the deflection system is in communication with the atmosphere through at least one of the hollow posts.

The solution afforded by the invention brings with it the following advantages: the hollow posts, which can also be regarded as spacers, form a kind of cage having wide spaces between the bars, through which spaces a perfectly good evacuation of the cathode area can be accomplished even if no separate vacuum connection is provided, i.e., in the case of the direct installation of the gun in a vacuum apparatus. Optionally, however, it is also possible to surround the hollow posts within a separate exhausting chamber which can be connected through an exhaust nipple to a separate exhausting system. It is only the location of the flange whereby the gun is fastened to the vacuum chamber that changes according to whether or not such an exhausting chamber is present.

Inasmuch as the chamber containing the electromagnetic lens and the deflection system communicates with the atmosphere through at least one of the hollow posts, the coils themselves are located neither in the coolant nor in the vacuum. A vacuum in the area of the coils would result in the occurrence of glow discharges and/or flashovers leading soon to the destruction of the parts involved. Moreover, the outgassing of the coils when they become heated would lead to an undesirable increase in pressure. An expensive, vacuum-tight encapsulation would be required, such as, for example, the welding of the coils into a metal housing. Air at atmospheric pressure, which is always available, is a comparatively desirable medium, which will assure the reliable operation of the coils.

It is the fact that the electon-optical components and coils are contained in an air-filled chamber that makes it easily possible for the individual parts to be replaced with identical or different parts, and it is thus possible by simple alterations in electron-optical components to adapt the geometry of the beam in an optimum manner to particular applications.

At the same time it is also possible, on the basis of the basic unit to be further described in greater detail, to install thereon a deflection head by which the electron beam can be deflected by an angle of preferably 90° into a vaporizing crucible. Moreover, with an additional, independent coil system the beam can be deflected perpendicularly thereto to permit the achievement of composite, especially circular, beam movements in the vaporizing crucible. In the case of square-wave deflection voltages, the beam can be made to jump back and forth periodically between two crucibles, thereby permitting the depositing of alloys from a vapor, for example. The broad possibility of combining different focusing lenses and deflection systems, provides great flexibility in regard to the adjustment of the focal point and power density of the electron beam.

It is furthermore possible to equip the basic unit with a symmetrical deflection system permitting deflection frequencies up to 500 Hz. Such an electron gun, designed especially for heating purposes, can be utilized for the uniform heating of steel bands or other broad substrates. It is also possible to provide the basic unit, which is to be described in detail, with additional deflection systems whereby large areas can be swept with certain energy distributions by the use of a deflection control apparatus. For example, a large evaporator bath can be heated.

An especially advantageous development of the subject matter of the invention is characterized in that two of the hollow posts serve as tubes for carrying a coolant, and the rest of the hollow posts serve as conduits for electrical conductors, pneumatic or hydraulic control tubes or mechanical linkages. In general, four hollow posts will be provided, so that two posts will be available for other than cooling purposes. The coolant will be fed exclusively to the beam guiding tube, which is of hollow walled construction for this purpose. The electrical conductors in the other hollow posts are, for example, leads for the electromagnetic lens and for the individual deflection systems. Mechanical, pneumatic or hydraulic linkages can be used, for example, for tilting crucibles, crucible drives, baffles, anode valves for replacement of the cathode during operation, etc.

For fastening reasons, it is especially advantageous for the hollow posts to be provided between two flange rings, the one joined to the replaceable unit and the other to the high-voltage part, and for passages to be provided in the flange rings for the distribution of the coolant. By appropriately designing the parts of the electron-optical part or of the beam guiding tube, as the case may be, to which the posts are to be connected, a fluid-tight connection can be achieved without the need for separate connecting lines for the purpose.

The electron gun of the invention can be further completed by an exhausting chamber surrounding the spacer posts and connected in a vacuum-tight manner to the surface of the gun, the said exhausting chamber being connectable by a connecting line to a vacuum pump, as has already been suggested above. The interior of the gun, i.e., the area surrounding the cathode, can thus be brought better and more rapidly to the vacuum necessary for the reliable operation of the gun. This is important especially in such procedures as reactive depositing from vapors or ion plating, in which a pressure gradient is maintained between the vaporizing crucible and the beam generator by an intermediate exhausting system with the anode as the compression stage. For example, pressures of the order of $10^{-1}$ mbar in the area of the vaporizing crucible and $10^{-4}$ mbar in the area of the cathode can easily be achieved by pumping down with diffusion pumps having an exhausting capacity of 400 l/sec.

An example of the embodiment of the invention and the details and manner of operation thereof will be explained with reference to FIGS. 1 to 3.

Figure 1:
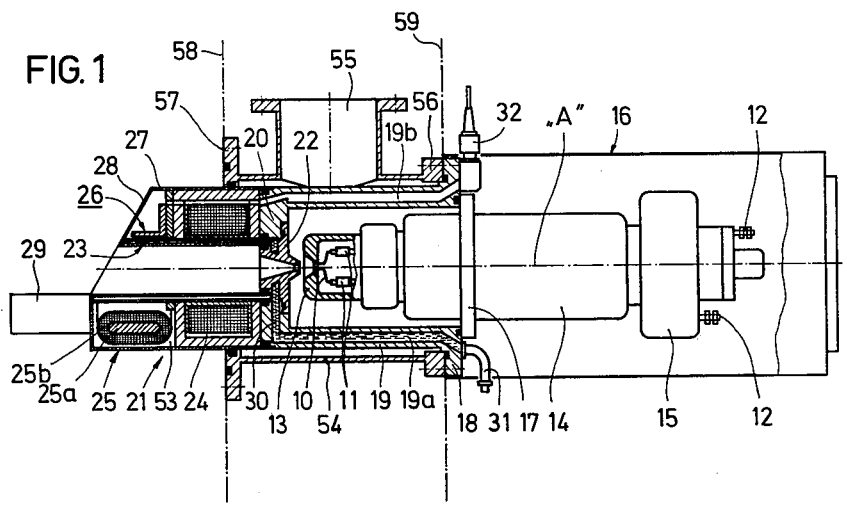
FIG. 1 is a longitudinal cross sectional view taken through a complete electron gun in the conventional operating position, i.e., with its axis disposed horizontally.

In FIG. 1, 10 designates a cathode which is fastened in the terminal clamps 11. The terminal clamps 11 are connected by conductors, whose further course is not shown, to the screw terminals 12 which can be connected to high-voltage terminals, which are not shown, which supply the accelerating voltage and the current for heating the cathode 10. The cathode is surrounded by a beam forming electrode (Pierce electrode) 13 which is at the same potential. Cathode 10 and beam forming electrode 13 are fastened in a conventional and therefore not further described manner to a high voltage insulator 14 bearing a heat sink 15 at its end adjacent the screw terminals 12. The screw terminals 12, the heat sink 15 and a substantial portion of the length of the high voltage insulator 14 are surrounded by a shield 16.

The high voltage insulator 14 has a flange 17 which is joined, with the interposition of a vacuum gasket not indicated in the drawing, to a flange ring 18 to which the shield 16 is also fastened. The flange ring 18 is joined, by means of four hollow posts 19 distributed about the circumference, only two of them being visible in the drawing, to another flange ring 20 which serves for the mounting of the unit 21 which will be further described below. The flange ring 20 is at ground potential, and has in its interior an accelerating anode 22, which is also mounted replaceably with the interposition of gaskets. The system described thus far is constructed in rotational symmetry with the long axis A of the electron gun.

The unit 21 consists of a beam guiding tube 23, an electromagnetic lens 24, an x-axis deflection system 25 and a y-axis deflection system 26 of which, however, only the upper pole shoe is visible in the drawing. The beam guiding tube 23 is surrounded by a coaxial jacket tube 27, and electromagnetic lens 24 and the deflections systems 25 and 26 are disposed in the annular space 53 between the beam guiding tube and the jacket tube.

The beam guiding tube 23 and the jacket tube 27 are joined together in a vacuum-tight manner at the ends farthest from the cathode 10 by means of an end plate 28. The x-axis deflection system 25 consists of a yoke 25a on which a deflection coil 25bis provided. The yoke 25a is attached at both ends to pole shoes 29 of which, however, only the rear pole shoe is visible in FIG. 1.

The beam guiding tube 23 is of hollow walled construction, a coolant such as water, for example, flowing through the space 52 within the wall. The connection to a cooling water circuit is established through distribution channels 30 and bores 19a in the hollow posts 19 and through connecting lines 31 of which only one appears in the drawing. The electrical connections of the deflection systems 25 and 26 and of the electromagnetic lens 24 are made through a multiple-pin connector 32 and a bore 19b in another of the hollow posts 19.

The electron gun is surrounded in the area of the hollow posts 19, over no less than their entire length, with the maintenance of a space, by a sleeve-like exhausting chamber 54 into which a connecting conduit 55 enters radially. The connecting conduit 55 is connectable to a vacuum pump which is not represented. The exhausting chamber 54 has annular flanges 56 and 57 at its extremities. The exhausting chamber is joined in a vacuum-tight manner to the flange ring 18 by the annular flange 56, with the interposition of a gasket. By means of the annular flange 57, the vacuum chamber 54, and with it the entire electron gun, can be connected in a vacuum-tight manner to a vacuum tank, which is not represented. The broken line 58 represents only the plane of installation or mounting of the apparatus on the said vacuum tank. In the case represented in FIG. 1, the interior of the exhausting chamber 54 can be evacuated separately, the small beam aperture in the center of the accelerating anode 22 creating a pressure gradient. In this manner it is possible to produce in the exhausting chamber 54 and hence in the area of the cathode 10 a vacuum greater by several powers of ten than in the vacuum chamber, for example, into which the pole shoes 29 extend.

It is also possible, of course, to omit the exhausting chamber 54 in the apparatus of FIG. 1. In this case the electron gun will be fastened to the appropriate vacuum chamber by means of the flange ring 18, the plane of its mounting on said chamber being represented by the broken line 59. It is easy to understand that in such a case, substantially the same vacuum can be achieved in the area of the cathode 10 as in the area of the pole shoes 29. However, it is apparent in any case that the hollow posts 19 permit a virtually unimpeded evacuation of the area which they circumscribe.

Figure 2:
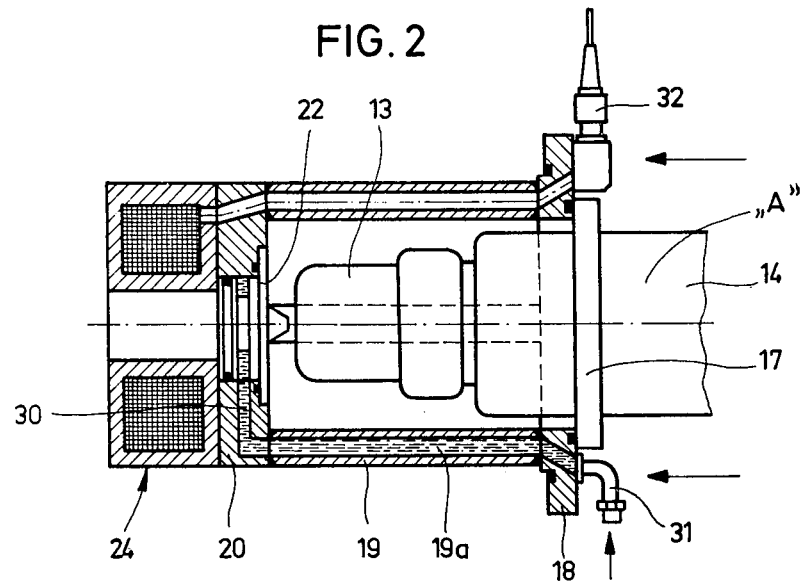
FIG. 2 is a detail of the subject of FIG. 1 in the area of the hollow posts.

In FIG. 2 the parts identical to those of FIG. 1 are provided with the same reference numbers. It can be seen that an electromagnetic lens 24 of a different size is mounted on the flange ring 20. The beam guiding tube and the jacket tube have been omitted from the drawing for the sake of simplicity. Different electron-optical systems as well as different kinds of deflection systems can be mounted on the electromagnetic lens 24.

Figure 3:
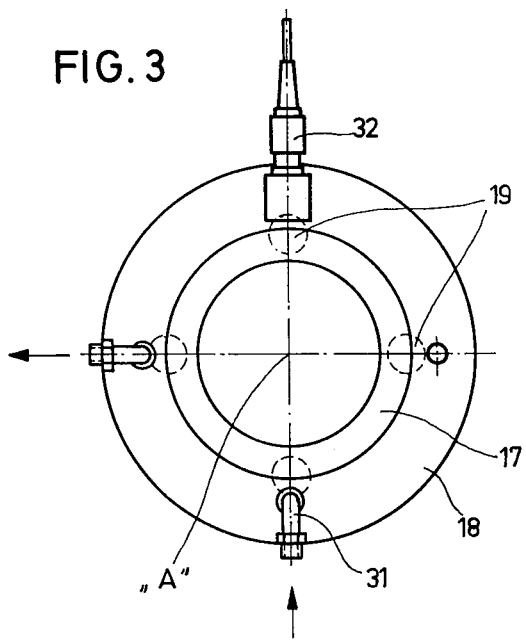
FIG. 3 is an end view of the subject of FIG. 2.

The use of the same reference numbers extends also to FIG. 3, wherein it can be seen that four hollow posts 19 are disposed symmetrically about the axis A and, together with the flange rings 18 and 20 (FIG. 2), form a kind of cage which has great mechanical strength, yet does not appreciably interfere with the exhausting process.

The space 53 between the beam guiding tube 23 and the jacket tube 27 communicates, as best seen in FIG. 1, with the atmosphere through the bore 19b in one of the hollow posts 19, so that the milieu of the electromagnetic lens 24 and of the deflection systems 25 and 26 is under atmospheric pressure.

What is claimed is:

1. Electron gun for heating, fusing and vaporizing having a high voltage portion, electron emitting cathode means, at least one beam forming electrode means associated with the cathode means, accelerating anode means, beam guiding tube means extending in the direction of the beam path and surrounded by jacket tube means, electromagnetic lens means and one or more deflection systems positioned in the space formed between the beam guiding tube means and the jacket tube means, said beam guiding tube means, jacket tube means, electromagnetic lens means and the deflection systems being contained in a single, replaceable unit which is joined by a plurality of hollow post means parallel to the gun axis of the high voltage portion of the gun and disposed between two flange ring means having distribution passages for coolant disposed therein one of which is connected to said replaceable unit and the other to said high voltage portion and wherein the space for the electromagnetic lens means and the deflection systems communicates with the atmosphere through at least one of the hollow posts means.

2. Electron gun of claim 1 wherein two of the hollow post means serve as conduits for the coolant and the other hollow post means serve as passageways for electrical conductors and mechanical, pneumatic or hydraulic actuating means.

3. Electron gun of claim 1 wherein exhausting chamber means surrounds the hollow post means and connects in a vacuum-tight manner with the gun surface, said exhausting chamber means being connected via conduit means to vacuum pump means.

* * * * *